(12) United States Patent
Fearing et al.

(10) Patent No.: US 7,914,912 B2
(45) Date of Patent: Mar. 29, 2011

(54) ACTIVELY SWITCHABLE NANO-STRUCTURED ADHESIVE

(75) Inventors: Ronald S. Fearing, Orinda, CA (US); Abraham Bachrach, Palo Alto, CA (US); Richard Groff, Berkeley, CA (US); Carmel Majidi, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 1208 days.

(21) Appl. No.: 11/271,103

(22) Filed: Nov. 10, 2005

(65) Prior Publication Data
US 2008/0014465 A1 Jan. 17, 2008

Related U.S. Application Data

(60) Provisional application No. 60/626,893, filed on Nov. 10, 2004.

(51) Int. Cl.
*B32B 15/00* (2006.01)
(52) U.S. Cl. .................................. 428/692.1; 428/141
(58) Field of Classification Search .................. None
See application file for complete search history.

(56) References Cited

U.S. PATENT DOCUMENTS

| | | | |
|---|---|---|---|
| 3,609,468 A * | 9/1971 | Kihara et al. ............... 361/526 |
| 4,545,831 A | 10/1985 | Ornstein |
| 4,704,745 A | 11/1987 | Reaver |
| 5,264,722 A | 11/1993 | Tonucci et al. |
| 5,392,498 A | 2/1995 | Goulait et al. |
| 5,843,657 A | 12/1998 | Liotta et al. |
| 5,843,767 A | 12/1998 | Beattie |
| 5,951,931 A | 9/1999 | Murasaki et al. |
| 5,959,200 A | 9/1999 | Chui et al. |
| 6,055,680 A | 5/2000 | Tolbert |
| 6,329,738 B1 * | 12/2001 | Hung et al. ............... 310/309 |
| 6,393,327 B1 | 5/2002 | Scribner |
| 6,713,151 B1 | 3/2004 | Dean et al. |
| 6,737,160 B1 | 5/2004 | Full et al. |
| 6,863,942 B2 * | 3/2005 | Ren et al. ............... 428/36.9 |
| 6,872,439 B2 | 3/2005 | Fearing et al. |
| 6,875,274 B2 * | 4/2005 | Wong et al. ............... 117/105 |

(Continued)

FOREIGN PATENT DOCUMENTS

JP 2002-307398 A 10/2002

(Continued)

OTHER PUBLICATIONS

Shahinpoor, M.; Micro-electro-mechanics of Ionic Polymer Gets as Electrically Controllable Artificial Muscles, J. Intelligent Material Systems and Structures, vol. 6, pp. 307-314 (1995).

(Continued)

*Primary Examiner* — Mark Ruthkosky
*Assistant Examiner* — Sathavaram I Reddy
(74) *Attorney, Agent, or Firm* — Morrison & Foerster LLP

(57) ABSTRACT

Described herein is a microstructure having a substrate and a plurality of nano-fibers attached to the substrate. Each nano-fiber moves between the first and second states without an external mechanical load being applied to the nano-fibers. Each nano-fiber is configured to move between a first state and a second state in response to applied electricity, magnetism, chemical solution, heat, or light. Each nano-fiber is straight in the first state and curved in the second state, and when the nano-fibers are in the second state and in contact with a contact surface, the nano-fibers adhere to the contact surface.

17 Claims, 3 Drawing Sheets

U.S. PATENT DOCUMENTS

| | | | |
|---|---|---|---|
| 7,264,876 B2* | 9/2007 | Smalley et al. | 428/407 |
| 7,294,397 B2* | 11/2007 | Jagota et al. | 428/357 |
| 2002/0100581 A1 | 8/2002 | Knowles et al. | |
| 2003/0124312 A1 | 7/2003 | Autumn | |
| 2003/0142456 A1* | 7/2003 | Carnahan | 361/233 |
| 2003/0143398 A1* | 7/2003 | Ohki et al. | 428/398 |
| 2003/0143453 A1 | 7/2003 | Ren et al. | |
| 2003/0185741 A1* | 10/2003 | Matyjaszewski et al. | 423/445 R |
| 2003/0208888 A1* | 11/2003 | Fearing et al. | 24/442 |
| 2004/0005454 A1 | 1/2004 | Full et al. | |
| 2004/0009353 A1 | 1/2004 | Knowles et al. | |
| 2004/0058153 A1* | 3/2004 | Ren et al. | 428/408 |
| 2004/0071870 A1* | 4/2004 | Knowles et al. | 427/200 |
| 2004/0076822 A1 | 4/2004 | Jagota et al. | |
| 2004/0206448 A1* | 10/2004 | Dubrow | 156/276 |
| 2005/0072509 A1 | 4/2005 | Full et al. | |
| 2005/0092414 A1* | 5/2005 | Jones et al. | 152/210 |
| 2005/0181170 A1 | 8/2005 | Fearing et al. | |
| 2005/0230270 A1* | 10/2005 | Ren et al. | 205/777.5 |

FOREIGN PATENT DOCUMENTS

| | | |
|---|---|---|
| WO | WO-99/32005 | 7/1999 |
| WO | WO-01/49776 | 7/2001 |
| WO | WO-03/095190 | 11/2003 |

OTHER PUBLICATIONS

Uchino, K; Poosanaas, P; Tonooka, K: Photostrictive Actuators—New Perspective; Ferroelectrics 258; pp. 439-450 (Jan. 4, 2001).

Autumn, Kellar et al., (Jun. 8, 2000) "Adhesive force of a single gecko foot-hair," Nature, 405: 681-658.

Cartmill, Matt (1985) "Chapter 5: Climbing," in *Functional Vertebrate Morphology*, M. Hildebrand et al. eds., Belknap Press of Harvard University Press, Cambridge, MA, pp. 73-88.

Edwards, John S. et al., (1970) "The adhesive pads of Heteroptera: a re-examination," Proc. R. ent. Socl. Lond. 45(1-3): 1-5.

Fearing et al., pending U.S. Appl. No. 11/143,372;, filed Jun. 1, 2005.

Hora, Sunder Lal (1923) "The Adhesive Apparatus on the Toes of certain Geckos and Tree-frogs," Journal of the Asiatic Society of Bengal 9: 137-145.

Irschick, Duncan J. et al., (1996) "A comparative analysis of clinging ability among pad-bearing lizards," Biological Journal of the Linnean Society, 59: 21-35.

Janra (Oct. 18, 2002) "Gecko feet in-hair-ently sticky (Science)," <http://www.kuro5shin.org/?op=displaystory;sid=2002/10/18/03840/816>, printed Nov. 17, 2005, 12 pages.

Liang, Yiching A. et al., (Jun. 2000) "Adhesion Force Measurements on single Gecko Setae," Technical Digest of the 2000 Solid-State Sensor and Actuator Workshop, Jun. 4-8, 2000, Hilton Head Island, SC, pp. 33-38.

Maderson, P. F. A. (Aug. 15, 1964) "Keratinized Epidermal Derivatives as an Aid to Climbing in Gekkonid Lizards," Nature, 203: 780-781.

Mahendra, Beni Charan, (1941) "Contributions to the Bionomics, Anatomy, Reproduction and Development of the Indian House-Gecko, *Hemidactylus Flaviviridis* Ruppel," Proceedings of the Indian Academy of Science, 13(5) Sec. B: 288-306.

Paul, Robert C. et al., (Oct. 21, 1999) "How do flies and other insects walk up walls, ceilings and even apparently smooth glass windows?" <http://www.sciam.com/askexpert_question.cfm?articleID=00053735-601D-1C72-9EB7809EC588F2D7>, 2 pages.

Peterson, J. A. et al., (Jul. 21, 1981) "A case study in retrograde evolution: the *onca* lineage in anoline lizards. II. Subdigital fine structure," Bulletin of the Museum of Comparative Zoology, 149(4): 215-268.

Ruibal, Rodolfo et al., (Nov. 1965) "The Structure of the digital Setae of Lizards," Journal of Morphology, 117: 271-294.

Russell, Anthony P. (1975) "Contribution to the functional analysis of the foot of the Tokay, *Gekko gecko* (Reptilla: Gekkonidae)," Zool. Lond., 176: 437-476.

Shahinpoor, Mohsen (May 1995) "Micro-Electro-Mechanics of Ionic Polymeric Gels as Electrically Controllable Artificial Muscles," Journal of Intelligent Material Systems and Structures, 6: 307-314.

Sitti, Metin et al., (Sep. 2002) "Synthetic Gecko Foot-Hair Micro/Nano-Structures for Future Wall-Climbing Robots," Proceedings of the IEEE International Conference on Robotics and Automation, ICRA 2003, Sep. 14-19, 2003, Taipei, Taiwan, 7 pages.

Spice, (Jul. 7, 2003) "Scientists unravel mystery of gecko's sticky feet," post-gazette.com Health & Science, <http://web.archive.org/web/20030709183536/http://www.post-gazette.com/healthscience/...>, printed Nov. 17, 2005, 6 pages.

Stork, N. E., (Mar. 1980) "A scanning electron microscope study of tarsal adhesive setae in the Coleoptera" Zoological Journal of the Linnean Society, 68: 173-306.

Stork, N. E. (Oct. 1980) "Experimental analysis of adhesion of *chrysolina polita* (Chrysomelidae: Coleoptera) on a variety of surfaces," J. exp. Biol., 88: 91-107.

Thurn-Albrecht, T.. et al., (Dec. 15, 2000) "Ultrahigh-Density Nanowire Arrays Grown in Self-Assembled Diblock Copolymer Templates," Science, 290: 2126-2129.

Uchino, K. et al., (Jan. 4, 2001) "Photostrictive Actuators—New Persepctive," Ferroelectrics, 258: 439-450.

Williams, E. E. (Mar. 19, 1982) "Convergent and Alternative Designs in the Digital Adhesive Pads of Scincid Lizards," Science, 215: 1509-1511.

* cited by examiner

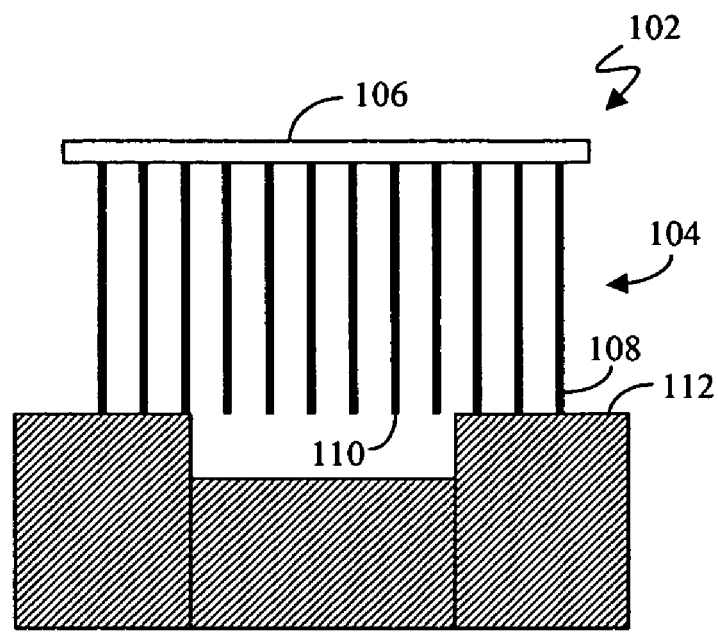
Fig. 1-A
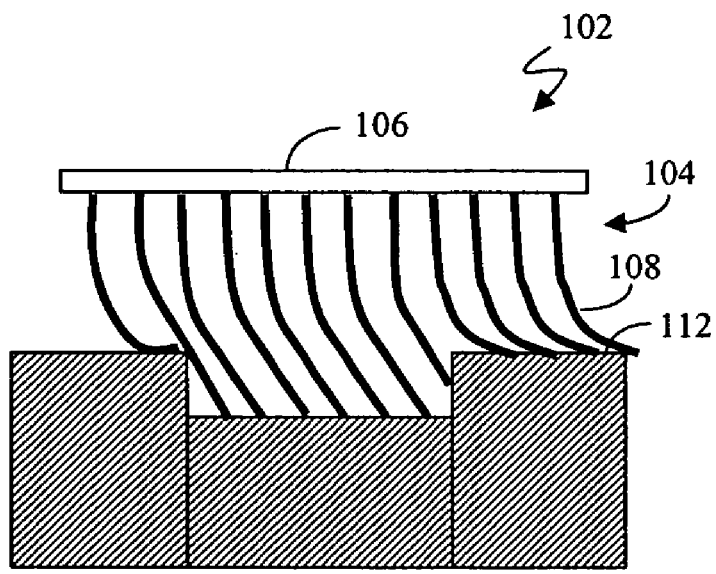
Fig. 1-B

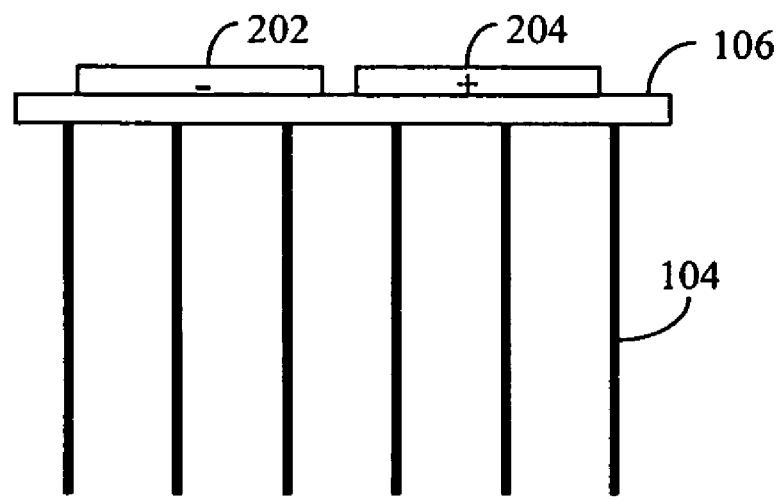
Fig. 2-A
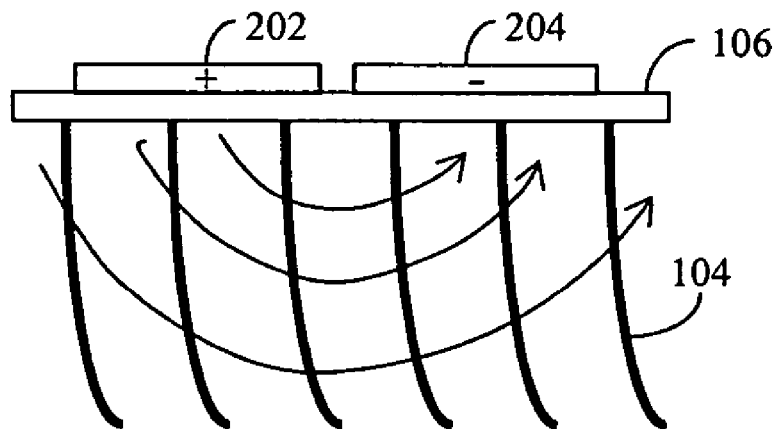
Fig. 2-B

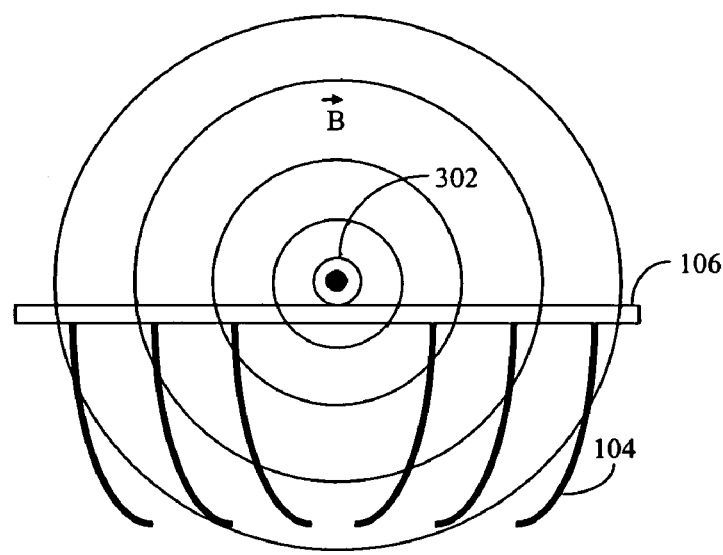
Fig. 3
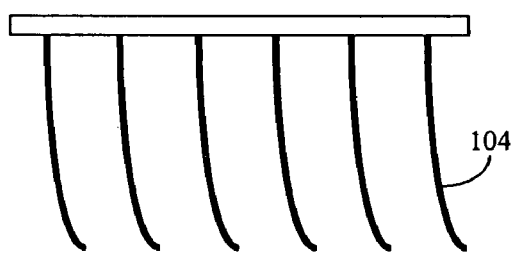
Fig. 4-A
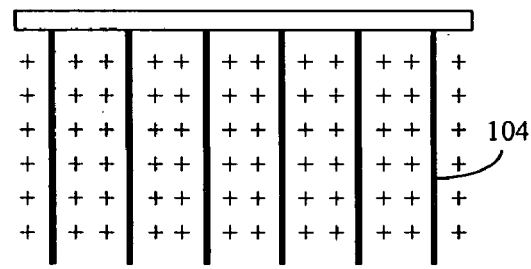
Fig. 4-B

ACTIVELY SWITCHABLE NANO-STRUCTURED ADHESIVE

CROSS-REFERENCE TO RELATED APPLICATIONS

This application claims the benefit under 35 USC 119(e) of U.S. Provisional Application No. 60/626,893, filed Nov. 10, 2004, which is incorporated herein by reference.

STATEMENT REGARDING FEDERALLY SPONSORED RESEARCH OR DEVELOPMENT

This invention was made with Government support under Grant (Contract) No. EEC-0304730 awarded by the National Science Foundation Nanoscale Interdisciplinary Research Teams. The Government has certain rights in this invention.

BACKGROUND

1. Field

This application generally relates to the fabrication and utilization of micron-scale structures. More particularly, this application relates to an actively switchable adhesive nanostructure.

2. Related Art

There is an ongoing need for improved adhesives. Improved adhesives have applications ranging from everyday aspects of life (e.g., tape, fasteners, and toys) to high technology (e.g., removal of microscopic particles from semiconductor wafers, transporting fiber optic devices, and assembly of sub-mm mechanisms, particularly those including micro-fabricated components, or components that cannot tolerate grippers, adhesives, or vacuum manipulators).

Adhesive mechanisms in nature have been studied, but have not been fully understood or exploited. For example, Geckos are exceptional in their ability to rapidly climb up smooth vertical surfaces. The mechanism of adhesion used by Geckos, Anolis lizards, some skinks, and some insects, has been debated for nearly a century.

It would be highly desirable to control the adhesive force mechanism utilized by Geckos and other animals and insects, resulting in the utilization of new adhesive microstructures and the fabrication of such structures.

SUMMARY

Described herein are fabricated microstructures. A microstructure comprises a substrate and a plurality of nano-fibers attached to the substrate. Each nano-fiber moves between the first and second states without an external mechanical load being applied to the nano-fibers. Each nano-fiber is configured to move between a first state and a second state in response to applied electricity, magnetism, chemical solution, heat, or light. Each nano-fiber is straight in the first state and curved in the second state, and when the nano-fibers are in the second state and in contact with a contact surface, the nano-fibers adhere to the contact surface.

Also described herein is a method of forming a fabricated microstructure. The method comprises forming a plurality of nano-fibers attached to a substrate. The nano-fibers configured to move between a first state and a second state in response to applied electricity, magnetism, chemical solution, heat, or light. The nano-fibers are straight in the first state and curved in the second state, and when the nano-fibers are in the second state and in contact with a contact surface, the nano-fibers adhere to the contact surface.

Also described herein is a method of adhering a fabricated microstructure to a contact surface. The method comprises moving a plurality of nano-fibers attached to a substrate from a first state in which the nano-fibers are straight to a second state in which the nano-fibers are curved by applying electricity, magnetism, chemical solution, heat, or light to the nano-fibers; and placing the substrate on the contact surface to adhere the nano-fibers in the second state to the contact surface. In an alternate embodiment, the nano-fibers in the first straight state can first be placed in contact with the contact surface, then curved by applying electricity, magnetism, chemical solution, heat, or light to the nano-fibers to adhere the nano-fibers to the contact surface.

DESCRIPTION OF DRAWING FIGURES

FIG. 1A illustrates an exemplary fabricated microstructure array of nano-fibers attached to a substrate.

FIG. 1B illustrates the condition where a stalk of a nano-fiber is curved to form a smaller contact angle with a contact surface.

FIG. 2A illustrates an exemplary embodiment where nano-fibers are differentially coated with an electroactive polymer (EAP).

FIG. 2B illustrates the condition where a voltage is applied to the electrodes and an electric field is generated to bend the nano-fibers without applying an external mechanical load on the nano-fibers.

FIG. 3 illustrates an exemplary embodiment where the nano-fibers include ferromagnetic or paramagnetic material, and a wire is disposed on a substrate.

FIG. 4A illustrates an exemplary embodiment where the nano-fibers are configured to be normally curved.

FIG. 4B illustrates the condition where a charge is applied and the nano-fibers can be configured to straighten.

DETAILED DESCRIPTION

With reference to FIG. 1-A, in one exemplary embodiment, a fabricated microstructure array 102 of nano-fibers 104 attached to a substrate 106 is depicted. Substrate 106 can be rigid or flexible. Each nano-fiber 104 includes a stalk 108 and a terminus 110. In general, stalk 108 may be between about 0.5 microns and 100 microns in length. The diameter of stalk 108 is between about 50 nanometers (nm) and 2.0 microns. In the present embodiment, terminus 110 is a flat end with essentially the same shape as stalk 108. It should be recognized, however, that terminus 110 can have any shape. For example, terminus 110 may be in the form of a paddle or flattened surface, a flattened segment of a sphere, an end of a cylinder, a sphere, or a blunt end.

In the present exemplary embodiment, when stalk 108 of a nano-fiber 104 is straight and oriented substantially perpendicular to a contact surface 112, nano-fiber 104 is unlikely to engage, and therefore will not likely adhere to contact surface 112. However, with reference to FIG. 1-B, when stalk 108 of nano-fiber 104 is curved to form a smaller contact angle with contact surface 112, nano-fiber 104 will more likely adhere to contact surface 112. It should be recognized that a portion of the length or the entire length of nano-fiber 104 can be curved.

In particular, each nano-fiber 104 of array 102, when engaged with contact surface 112, mimics the adhesive properties of nano-fibrous spatulae situated on setae of a Tokay Gecko. Each nano-fiber 104 engages with and adheres to contact surface 112 using van der Waals forces and other intermolecular forces. In certain embodiments, the average force provided at contact surface 112 by a single nano-fiber 104 is between about 0.06 to 0.20 μN, or between about 60 and 200 nano-Newtons. In other embodiments, the average force provided at contact surface 112 by a single nano-fiber 104 is between about 1.00 and 200 nano-Newtons. In other embodiments, nano-fiber 104 can provide a substantially normal adhesive force of between about 20 and 8,000 nano-Newtons. In still other embodiments, nano-fiber 104 can provide a substantially parallel adhesive force of between about 5 and 2,000 nano-Newtons.

As depicted in FIG. 1-B, by proper choice of nano-fiber length, angle, density and diameter, and substrate material, nano-fibers 104 can adhere to rough surfaces. To avoid tangling, nano-fibers 104 are optimally sufficiently stiff and separated while still sufficiently dense to provide enough adhesion force. A further discussion of such design characteristics of nano-fibers 104 that are configured to mimic gecko seta is found in U.S. Pat. No. 6,737,160 and U.S. patent application Ser. No. 10/197,763, each of which is hereby incorporated by reference in its entirety.

Nano-fibers 104 can be made from various materials, such as polymers, for example, polyester, polyurethane and polyimide. Nano-fibers 104 can be fabricated using any number of techniques, including an oxide/nitride process. For a further discussion of techniques for fabricating nano-fibers 104, see U.S. Pat. No. 6,737,160 and U.S. patent application Ser. No. 10/197,763, each of which is hereby incorporated by reference in its entirety.

In one exemplary embodiment, nano-fibers 104 are configured to move between a first state and a second state in response to applied electricity, magnetism, chemical solution, heat, or light without a load applied to nano-fibers 104. As depicted in FIG. 1-A, in the first state, nano-fibers 104 are straight. As depicted in FIG. 1-B, in the second state, nano-fibers 104 are curved. Thus, in this manner, nano-fibers 104 are actively switchable between the first state and second state without an external mechanical load applied to nano-fibers 104.

As described above, when nano-fibers 104 are straight (i.e., in the first state), they are unlikely to engage with contact surface 112. When nano-fibers 104 are curved (i.e., in the second state), they are more likely to adhere to contact surface 112. Thus, by switching between the first state and the second state, nano-fibers 104 switch from being unlikely to engage with contact surface 112 to being more likely to adhere to contact surface 112.

The ability to switch between the first and the second state can be used in any number of applications where control of adhesion between two objects is desired. For example, nano-fibers 104 can be disposed on the foot of a robot. When desired, such as to adhere the foot to a surface, nano-fibers 104 on the foot can be made to be adhesive (i.e., moved to the second state). To lift the foot from the surface, nano-fibers 104 on the foot can be made to release (i.e., moved to the first state).

In one exemplary embodiment, with reference to FIG. 2-A, nano-fibers 104 are differentially coated with an electroactive polymer (EAP). In particular, a nano-fiber 104 is differentially coated by coating a portion of the nano-fiber 104 while not coating another portion (i.e., the nano-fiber is non-uniformly coated). As depicted in FIG. 2-A, a set of electrodes 202, 204 can be disposed on substrate 106 adjacent to the base of nano-fibers 104. Electrodes 202, 204 are positive and negative pairs. In the exemplary embodiment depicted in FIG. 2-A, electrode 202 is positive, and electrode 204 is negative. Any number of sets of electrodes 202, 204 can be disposed at intervals close enough to achieve the desired field strength.

With reference to FIG. 2-B, when a voltage is applied to electrodes 202, 204, an electric field is generated. As depicted in FIG. 2-B, the outward arcs of the electric field pass through nano-fibers 104 to activate the EAP material. In response to the generated electric field, due to the strain differential between the EAP material and the substructure of nano-fibers 104, the EAP material on nano-fibers 104 contracts to bend nano-fibers 104 without applying an external mechanical load on nano-fibers 104. When the voltage is no longer applied, nano-fibers 104 return to the first state (i.e., nano-fibers 104 are straight).

In another exemplary embodiment, rather than EAP material, nano-fibers 104 are differentially coated with a magnetostrictive material such as a terbium/dysprosium alloy, for example Terfenol-D. Also, rather than applying an electric field, a magnetic field is applied to activate the magnetostrictive material to bend nano-fibers 104. Similarly, nano-fibers 104 can be differentially coated with a chemically-responsive material to bend nano-fibers 104. For example, a pH change on a gel can induce a strain. (See, Shahinpoor, M., Micro-electro-mechanics of Ionic Polymer Gels as Electrically Controllable Artificial Muscles, J. Intelligent Material Systems and Structures, Vol. 6, pp. 307-314 (1995), which is incorporated herein by reference in its entirety.) Also, nano-fibers 104 can be differentially coated with a heat-sensitive or a light-sensitive material to bend nano-fibers 104 in response to applied heat or light, respectively. For example, nano-fibers can be made from two metals with different coefficients of thermal expansion, such as in a bimetallic strip used in thermostats. A coating of a photostructive material, such as lead lanthanum zirconate titanate (PLZT) would allow nano-fibers 104 to bend when exposed to light. (See, Uchino, K; Poosanaas, P; Tonooka, K; Photostrictive Actuators—New Perspective; Ferroelectrics 258; pp. 439-450 (Jan. 4, 2001), which is incorporated herein by reference in its entirety.)

With reference to FIG. 3, in another exemplary embodiment, nano-fibers 104 include ferromagnetic material, such as nickel or iron alloys. For example, nano-fibers 104 can be differentially coated with ferromagnetic material, or formed from ferromagnetic material. As depicted in FIG. 3, in the present exemplary embodiment, a wire 302 is disposed on substrate 106. When a current is applied to wire 302, a magnetic field is generated. As depicted in FIG. 3, the arcs of the generated magnetic field pass through nano-fibers 104. In response to the generated magnetic field, paramagnetic and ferromagnetic material is activated to bend nano-fibers 104 without applying a load on nano-fibers 104.

In the exemplary embodiments described above, nano-fibers 104 were described as moving from the first state to the second state in response to applied electricity, magnetism, chemical solution, heat, or light. Additionally, nano-fibers 104 were described as remaining in or returning to the first state when electricity, magnetism, chemical solution, heat, or light is not applied. It should be recognized, however, that nano-fibers 104 can be configured to move from the second state to the first state in response to applied electricity, magnetism, chemical solution, heat or light without applying a load on nano-fibers 104. Additionally, nano-fibers 104 can be configured to remain in or return to the second state when electricity, magnetism, chemical solution, heat, or light is not applied.

For example, with reference to FIG. 4-A, nano-fibers 104 are configured to be normally in state two (i.e., curved). As depicted in FIG. 4-B, when a charge is applied, nano-fibers 104 can be configured to move to state one (i.e., straight).

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A fabricated microstructure, comprising:
   a substrate;
   a set of electrodes or a wire disposed on the substrate; and
   a nano-fiber attached to the substrate,
   wherein the nano-fiber is differentially coated with an electroactive polymer, magnetostrictive material, paramagnetic, or ferromagnetic material to leave a portion of the nano-fiber coated with the electroactive polymer, magnetostrictive material, paramagnetic, or ferromagnetic material and another portion of the nano-fiber uncoated,
   wherein the nano-fiber is electrically isolated from said set of electrodes or wire,
   the nano-fiber configured to move between a first state and a second state in response to an electric field applied by the set of electrodes or magnetic field applied by the wire, wherein the nano-fiber is straight in the first state and curved in the second state, wherein, when the nano-fiber is in the first state and in contact with a contact surface, the nano-fiber does not adhere to the contact surface, and wherein, when the nano-fiber is in the second state and in contact with the contact surface, the nano-fiber adheres to the contact surface.

2. The fabricated microstructure of claim 1, wherein in response to an applied voltage, the electrodes generate the electric field that activates the electroactive polymer on the nano-fiber to bend the nano-fiber.

3. The fabricated microstructure of claim 1, wherein in response to the applied magnetic field generated by the wire, the magnetostrictive material on the nano-fiber bends the nano-fiber.

4. The fabricated microstructure of claim 1, wherein in response to an applied current, the wire generates the magnetic field that activates the paramagnetic or ferromagnetic material to bend the nano-fiber.

5. The fabricated microstructure of claim 1, wherein the nano-fiber moves between the first and second states without an external mechanical load being applied to the nano-fiber.

6. The fabricated microstructure of claim 1, wherein the entire length of the nano-fiber is curved.

7. A fabricated microstructure, comprising:
   a substrate;
   a set of electrodes disposed on the substrate; and
   a plurality of nano-fibers attached to the substrate,
   wherein the nano-fibers are differentially coated with an electroactive polymer material to leave a portion of each nano-fiber coated with the electroactive polymer and another portion of the nano-fiber uncoated,
   wherein the nano-fibers are electrically isolated from said set of electrodes,
   the nano-fibers configured to move between a first state and a second state in response to an electric field applied by the set of electrodes, wherein each nano-fiber is straight in the first state and curved in the second state, wherein, when the nano-fibers are in the first state and in contact with a contact surface, the nano-fibers do not adhere to the contact surface, and wherein, when the nano-fibers are in the second state and in contact with the contact surface, the nano-fibers adhere to the contact surface.

8. The fabricated microstructure of claim 7, wherein in response to an applied voltage, the electrodes generate the electric field that activates the electroactive polymer on the nano-fibers to bend the nano-fibers.

9. The fabricated microstructure of claim 7, wherein the nano-fibers move between the first and second states without an external mechanical load being applied to the nano-fibers.

10. The fabricated microstructure of claim 7, wherein the entire length of each nano-fiber is curved.

11. A fabricated microstructure, comprising:
    a substrate;
    a wire disposed on the substrate; and
    a plurality of nano-fibers attached to the substrate,
    wherein the nano-fibers are differentially coated with a magnetostrictive material to leave a portion of each nano-fiber coated with the magnetostrictive material and another portion of the nano-fiber uncoated,
    wherein the nano-fibers are electrically isolated from said wire,
    the nano-fibers configured to move between a first state and a second state in response to a magnetic field applied by the wire, wherein each nano-fiber is straight in the first state and curved in the second state, wherein, when the nano-fibers are in the first state and in contact with a contact surface, the nano-fibers do not adhere to the contact surface, and wherein, when the nano-fibers are in the second state and in contact with a contact surface, the nano-fibers adhere to the contact surface.

12. The fabricated microstructure of claim 11, wherein in response to the magnetic field the magnetostrictive material bends the nano-fibers.

13. The fabricated microstructure of claim 11, wherein the nano-fibers move between the first and second states without an external mechanical load being applied to the nano-fibers.

14. The fabricated microstructure of claim 11, wherein the entire length of each nano-fiber is curved.

15. A fabricated microstructure, comprising:
    a substrate;
    a wire disposed on the substrate; and
    a plurality of nano-fibers attached to the substrate,
    wherein the nano-fibers are differentially coated with a paramagnetic or ferromagnetic material to leave a portion of each nano-fiber coated with the paramagnetic or ferromagnetic material and another portion of the nano-fiber uncoated,
    wherein the nano-fibers are electrically isolated from said wire,
    the nano-fibers configured to move between a first state and a second state in response to a magnetic field applied by the wire, wherein each nano-fiber is straight in the first state and curved in the second state, wherein, when the nano-fibers are in the first state and in contact with a contact surface, the nano-fibers do not adhere to the contact surface, and wherein, when the nano-fibers are in the second state and in contact with a contact surface, the nano-fibers adhere to the contact surface.

16. The fabricated microstructure of claim 15, wherein in response to the magnetic field the paramagnetic or ferromagnetic material bends the nano-fibers.

17. The fabricated microstructure of claim 15, wherein the nano-fibers move between the first and second states without an external mechanical load being applied to the nano-fibers.

* * * * *